United States Patent
Mayya et al.

(10) Patent No.: US 8,225,049 B2
(45) Date of Patent: Jul. 17, 2012

(54) DATA STORAGE DEVICE HAVING SELF-POWERED SEMICONDUCTOR DEVICE

(75) Inventors: Subramanya Mayya, Suwon-si (KR);
Hee-seok Kim, Seongnam-si (KR);
Ik-Soo Kim, Yongin-si (KR);
Min-Young Park, Suwon-si (KR);
Hyun-Suk Kwon, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 290 days.

(21) Appl. No.: 12/689,317

(22) Filed: Jan. 19, 2010

(65) Prior Publication Data
US 2010/0181605 A1 Jul. 22, 2010

(30) Foreign Application Priority Data

Jan. 21, 2009 (KR) .................. 10-2009-0005174

(51) Int. Cl.
*G06F 13/16* (2006.01)
(52) U.S. Cl. ...................................... 711/151; 257/298
(58) Field of Classification Search .................. 257/298, 257/E27.097; 361/502, 503; 711/151
See application file for complete search history.

(56) References Cited

U.S. PATENT DOCUMENTS

| | | | |
|---|---|---|---|
| 4,672,586 A | 6/1987 | Shimohigashi et al. | |
| 5,151,848 A | 9/1992 | Finello | |
| 5,153,710 A | 10/1992 | McCain | |
| 5,512,147 A | 4/1996 | Bates et al. | |
| 5,864,182 A | 1/1999 | Matsuzaki | |
| 6,576,365 B1 | 6/2003 | Meitav et al. | |
| 7,344,804 B2 | 3/2008 | Klaassen | |
| 2002/0188811 A1* | 12/2002 | Ma et al. ..................... 711/151 |
| 2005/0122791 A1 | 6/2005 | Hajeck | |
| 2007/0014076 A1* | 1/2007 | Omura et al. ............... 361/502 |
| 2007/0113108 A1 | 5/2007 | Lien | |
| 2007/0205509 A1 | 9/2007 | Joo et al. | |

FOREIGN PATENT DOCUMENTS

| | | |
|---|---|---|
| JP | 05265604 A | 10/1993 |
| JP | 10295048 A | 11/1998 |
| JP | 2005018825 A | 1/2005 |
| KR | 1020070057337 A | 6/2007 |

OTHER PUBLICATIONS

Kim, Han-Ki et al. and Yoon, Young Soo, "All solid-state rechargeable thin-film microsupercapacitor fabricated with tungsten cosputtered ruthenium oxide electrodes", J. Va. Sci. Technol. B, vol. 21, No. 3, May/Jun. 2003, pp. 949-952.

Sung, Joo-Hwan et al., "Flexible micro-supercapacitors", Journal of Power Sources, 2006, pp. 1467-1470 (www.sciencedirect.com).

Ma, Liping and Yang, Yang, "Solid-state supercapacitors for electronic device applications", Applied Physics Letters 87, 2005, pp. 123503-1-123503-3.

* cited by examiner

*Primary Examiner* — Thomas L Dickey
(74) *Attorney, Agent, or Firm* — Volentine & Whitt, PLLC

(57) ABSTRACT

Provided is a data storage device. The data storage device includes an interface, a buffer controller, a memory controller, a non-volatile memory, and a self-powered semiconductor device adjacent to and electrically connected to the buffer controller. The self-powered semiconductor device includes a semiconductor chip and a rechargeable micro-battery attached to the semiconductor chip. The rechargeable micro-battery includes a first current collector and a second current collector, which face each other, a first polarizing electrode in contact with the first current collector and facing the second current collector, a second polarizing electrode in contact with the second current collector and facing the first polarizing electrode, and an electrolyte layer formed between the first and second polarizing electrodes.

12 Claims, 12 Drawing Sheets

DATA STORAGE DEVICE HAVING SELF-POWERED SEMICONDUCTOR DEVICE

PRIORITY STATEMENT

This application claims priority under 35 U.S.C. §119 to Korean Patent Application No. 10-2009-0005174 filed on Jan. 21, 2009, the subject matter of which is hereby incorporated by reference.

BACKGROUND

Embodiments of the inventive concept relate to a semiconductor device, and more particularly, to a semiconductor device having an independent power source, a data storage device employing the power source, and a method of manufacturing same.

As electronic devices incorporating semiconductor devices are designed with increasing functionality and compact size, the constituent memory devices require a high level of integration density and fast operating speeds. Contemporary memory devices may be generally classified as volatile and non-volatile. Volatile memory devices, such as dynamic random access memories (DRAMs) or static random access memories (SRAMs), lose stored data when power supply is interrupted. Thus, research on a pseudo non-volatile memory is progressing in order to provide not only high operating speed, like a DRAM, but also the nonvolatile data retention characteristics of a non-volatile memory device.

SUMMARY

Embodiments provide a data storage device having a self-powered semiconductor device. Embodiments also provide a semiconductor device having an independent power source.

Embodiments are directed to a data storage device. The data storage device includes an interface and a buffer controller adjacent to and electrically connected to the interface. The data storage device includes a memory controller adjacent to and electrically connected to the buffer controller. The data storage device includes a non-volatile memory adjacent to and electrically connected to the memory controller. The data storage device also includes a self-powered semiconductor device adjacent to and electrically connected to the buffer controller. The self-powered semiconductor device includes a semiconductor chip and a rechargeable micro-battery attached to the semiconductor chip. The rechargeable micro-battery includes a first current collector and a second current collector, which face each other, a first polarizing electrode in contact with the first current collector and facing the second current collector, a second polarizing electrode in contact with the second current collector and facing the first polarizing electrode, and an electrolyte layer formed between the first and second polarizing electrodes.

In some embodiments, the rechargeable micro-battery may be composed of a plurality of sets of small-sized batteries.

In another embodiment, the self-powered semiconductor device may include a conductive plug. In this case, one of the first current collector and the second current collector may be electrically connected to a power supply pad of the semiconductor chip via the conductive plug.

In still another embodiment, the self-powered semiconductor device may include a separator formed between the semiconductor chip and the rechargeable micro-battery. The separator may be formed of one selected from the group consisting of a silicon oxide layer, a silicon nitride layer, a silicon oxynitride layer, a metal layer, a porous metal layer, a polymer layer and a combination thereof.

In yet another embodiment, the rechargeable micro-battery may include a battery substrate adjacent to the first current collector. The battery substrate may be a semiconductor substrate.

In yet another embodiment, the first and second polarizing electrodes may be formed of a material layer selected from the group consisting of RuO, IrO, CoO, ZrO, SrTiO, SrRuO, carbon nanotubes (CNTs), carbon nanofibers (CNFs), and activated carbon, and combinations thereof. For example, the first and second polarizing electrodes may be formed of a combination of $RuO_2$ and CNTs, or a combination of $RuO_2$ and activated carbon.

In yet another embodiment, the electrolyte layer may be formed of one selected from the group consisting of polymer gels, $LiClO_4$, $NaClO_4$, $LiAsF_6$, $BF^{-4}$, $CF_3SO^{-3}$, and quaternary phosphonium ($PH_4^-$) salts. The polymer gels may be polymer-salt complexes. The polymer may be one selected from the group consisting of polyethylene oxide, polyacrylonitrile, polymethylmethacrylate, polythiophine, polypyrrole, polyaniline, and combinations thereof, and the salt may be one selected from the group consisting of $SCN^-$, $I^-$, $ClO_4^-$, $CF_3SO_3^-$, $Li^+$ (LiPON, LiF) and $H^+$. For example, the electrolyte layer may be a LiF or LiPON layer.

In yet another embodiment, the first and second current collectors may be formed of one selected from the group consisting of Cu, W, WN, Co, Ru, Ni, Ag, Ti, TiN, Ta, TaN, Al, Au, Pt, Sn, and combinations thereof.

Other embodiments are directed to a self-powered semiconductor device including a first current collector and a second current collector, which are formed on one surface of the semiconductor chip to face each other. The self-powered semiconductor device includes a first polarizing electrode in contact with the first current collector and facing the second current collector. The self-powered semiconductor device includes a second polarizing electrode in contact with the second current collector and facing the first polarizing electrode. The self-powered semiconductor device also includes an electrolyte layer formed between the first and second polarizing electrodes.

BRIEF DESCRIPTION OF THE DRAWINGS

Embodiments are described in further detail below with reference to the accompanying drawings. It should be understood that various aspects of the drawings may have been exaggerated for clarity.

DETAILED DESCRIPTION OF THE EMBODIMENTS

Figure 1:
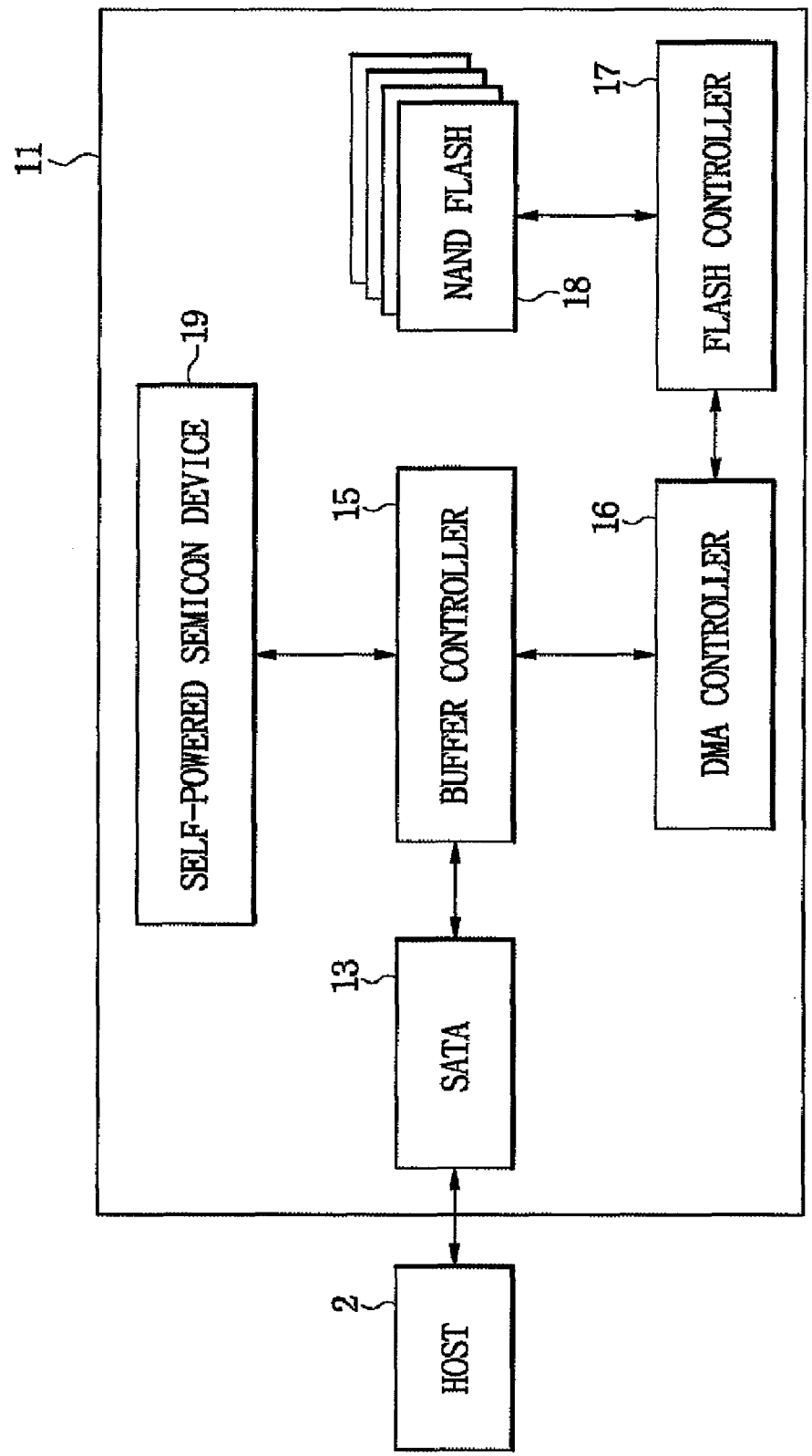
FIG. 1 shows a schematic configuration of a data storage device according to an embodiment of the inventive concept.

Various embodiments will now be described in some additional detail with reference to the accompanying drawings in which selected embodiments are shown. In the drawings, the thicknesses (or relative thicknesses) of layers and regions may be exaggerated for clarity. The specific structural and functional details disclosed herein are merely representative for purposes of describing embodiments. This inventive concept may be embodied in many alternate forms and should not be construed as being limited to only the illustrated embodiments.

Accordingly, while embodiments are capable of various modifications and alternative forms, embodiments thereof are shown by way of example in the drawings and will herein be described in detail. It should be understood, however, that there is no intent to limit embodiments to the particular forms disclosed, but on the contrary, embodiments are to cover all modifications, equivalents, and alternatives falling within the scope of the inventive concept. Throughout the written description and drawings, like numbers refer to like or similar elements.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of embodiments. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments only and is not intended to be limiting of embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof. Spatially relative terms, such as "beneath," "below," "lower," "above," "upper" and the like, may be used herein for ease of description to describe one element or a relationship between a feature and another element or feature as illustrated in the shapes. It will be understood that the spatially relative terms are intended to encompass different orientations of the device in use or operation in addition to the orientation depicted in the shapes. For example, if the device in the shapes is turned over, elements described as "below" or "beneath" other elements or features would then be oriented "above" the other elements or features. Thus, for example, the term "below" can encompass both an orientation which is above as well as below. The device may be otherwise oriented (rotated 90 degrees or viewed or referenced at other orientations) and the spatially relative descriptors used herein should be interpreted accordingly.

Embodiments are described herein with reference to cross-sectional illustrations that are schematic illustrations of idealized embodiments (and intermediate structures). As such, variations from the shapes of the illustrations as a result, for example, of manufacturing techniques and/or tolerances, may be expected. Thus, embodiments should not be construed as limited to the particular shapes of regions illustrated herein but may include deviations in shapes that result, for example, from manufacturing. For example, an implanted region illustrated as a rectangle may have rounded or curved features and/or a gradient (e.g., of implantation concentration) at its edges rather than an abrupt change from an implanted region to a non-implanted region. Likewise, a buried region formed by implantation may result in some implantation in the region between the buried region and the surface through which the implantation may take place. Thus, the regions illustrated in the shapes are schematic in nature and their shapes do not necessarily illustrate the actual shape of a region of a device and do not limit the scope.

It should also be noted that in some alternative implementations, the functions/acts noted may occur out of the order noted in the shapes. For example, two shapes shown in succession may in fact be executed substantially concurrently or may sometimes be executed in the reverse order, depending upon the functionality/acts involved.

In order to more specifically describe embodiments, various aspects will be described in detail with reference to the attached drawings. However, the inventive concept is not limited to only the illustrated embodiments.

FIG. 1 shows a schematic configuration of a data storage device according to an embodiment of the inventive concept.

Referring to FIG. 1, a data storage device, such as a solid state disk (SSD) 11, is illustrated. The SSD 11 comprises an interface 13, a buffer controller 15, a memory controller (DMA controller) 16, a flash controller 17, a NAND flash 18, and a self-powered semiconductor device 19. The SSD 11 is a device configured to store data using a semiconductor. The SSD 11 may have a high operating speed, a low mechanical delay or failure rate, and less heat and noise, and may be manufactured in a small size and light weight, compared to a hard disk drive (HDD). The SSD 11 may be used in a notebook PC, a desktop PC, an MP3 player, or a portable storage device.

The buffer controller 15 may be adjacent to and electrically connected to the interface 13. The DMA controller 16 may be adjacent to and electrically connected to the buffer controller 15. The flash controller 17 may be adjacent to and electrically connected to the DMA controller 16. The NAND flash 18 may be adjacent to and electrically connected to the flash controller 17. The self-powered semiconductor device 19 may be adjacent to and electrically connected to the buffer controller 15.

The interface 13 may be connected to a host 2 and thus serve to transmit and receive electrical signals such as data. For example, the interface 13 may be a device using standards such as SATA, IDE, SCSI, and/or a combination thereof. The NAND flash 18 may be connected to the interface 13 via the buffer controller 15, the DMA controller 16 and the flash controller 17. The NAND flash 18 may be replaced with another non-volatile memory such as a phase change memory. The NAND flash 18 may serve to store data received by the interface 13. Even when power supply to the SSD 11 is interrupted, the data stored in the NAND flash 18 are retained. The SSD 11 may include several other NAND flashes (not shown) connected in parallel to the buffer controller 15 to enlarge a data storage capacity, but it is omitted for simplicity of description.

The self-powered semiconductor device 19 may include rechargeable micro-batteries and a volatile memory. The volatile memory may be a DRAM and/or a SRAM. Hereinafter, for simplicity of description, it is assumed that the self-powered semiconductor device 19 includes the DRAM. The volatile memory operates at a relatively higher operating speed than a non-volatile memory such as the NAND flash 18. When the power supply to the SSD 11 is unstable or temporarily interrupted, the rechargeable micro-batteries may serve to provide auxiliary power to retain data stored in the volatile memory. Further, the rechargeable micro-batteries may serve to provide operating power to the SSD 11.

Meanwhile, a data processing speed of the interface 13 may be relatively higher than the operating speed of the NAND flash 18. For example, the interface 13 may operate at an operating speed of 66 MHz, and the NAND flash 18 may operate at an operating speed of 30 MHz or less. Here, the self-powered semiconductor device 19 may serve to temporarily store data. Data received through the interface 13 may be temporarily stored in the self-powered semiconductor device 19 via the buffer controller 15, and permanently stored in the NAND flash 18 according to a data writing speed of the NAND flash 18. Alternatively, frequently used data among the data stored in the NAND flash 18 may be temporarily stored in the self-powered semiconductor device 19 by previously reading the data. As a result, the self-powered semiconductor device 19 may increase the operating speed of the SSD 11 and reduce an error rate.

Figure 2:
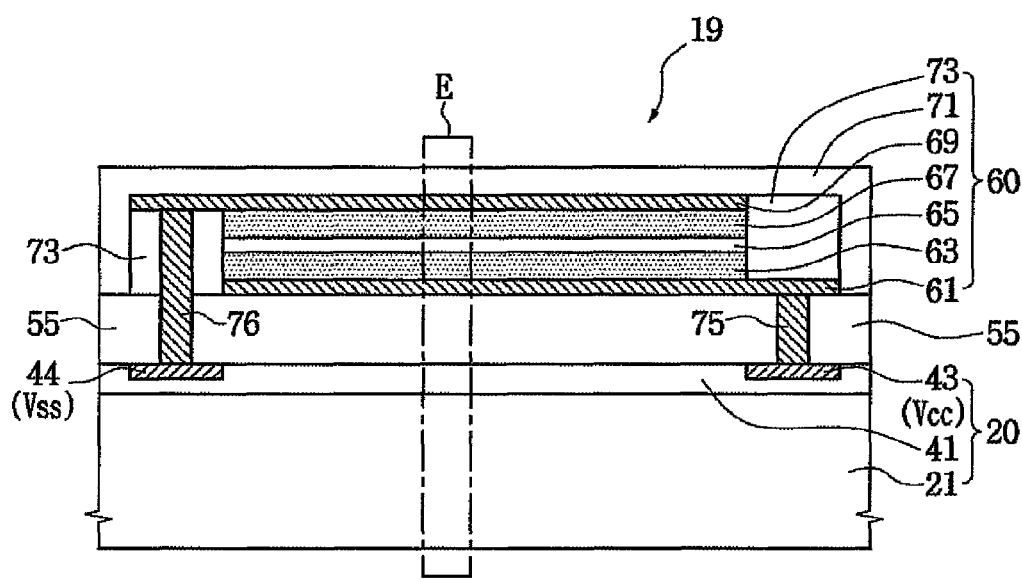
FIG. 2 is a cross-sectional view illustrating a self-powered semiconductor device and a method of manufacturing the same according to another embodiment of the inventive concept.
Figure 3:
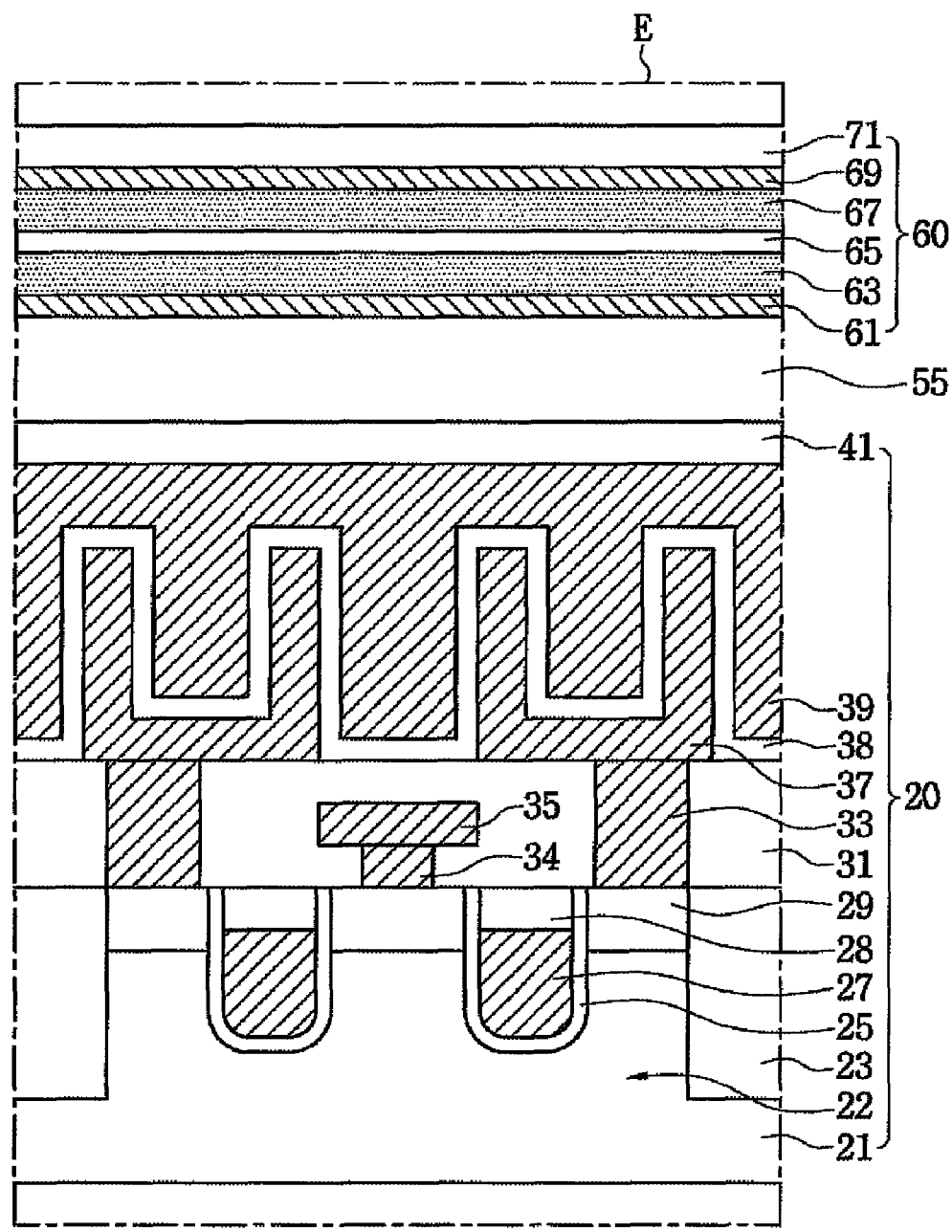
FIG. 3 is a more detailed cross-sectional view of region E shown in FIG. 2.
Figure 4:
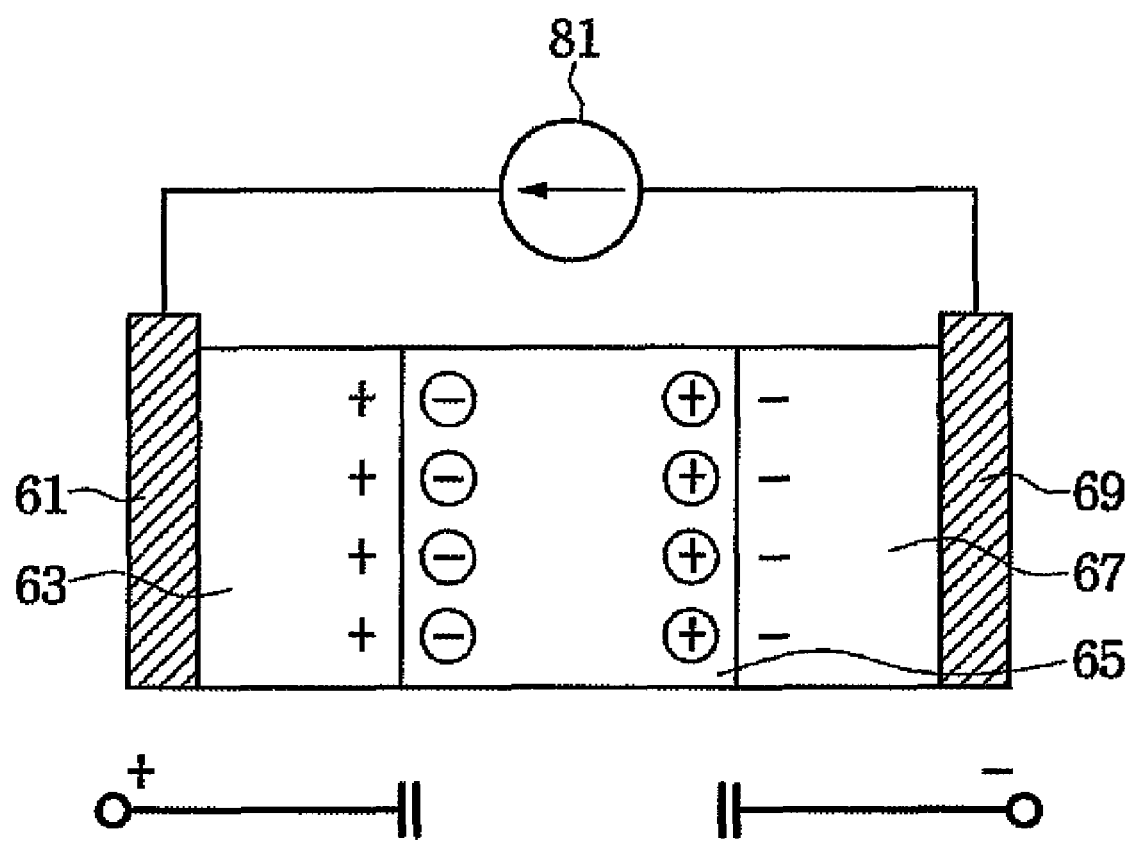
FIG. 4 is an equivalent circuit diagram further illustrating the operation of a rechargeable micro-battery.

FIG. 2 is a cross-sectional view illustrating a self-powered semiconductor device and a method of manufacturing the same according to another embodiment of the inventive concept. FIG. 3 is a cross-sectional view of region E of FIG. 2, and FIG. 4 is an equivalent circuit diagram further illustrating the operation of a rechargeable micro-battery.

Referring to FIGS. 2 and 3, a self-powered semiconductor device 19 according to the embodiment of the inventive concept comprises a semiconductor chip 20, a separator 55, and a rechargeable micro-battery 60. The semiconductor chip 20 may include various configurations such as a DRAM, a SRAM, a microprocessor, a programmable logic, and/or a combination thereof. Hereinafter, for simplicity of description, it is assumed that the semiconductor chip 20 is the DRAM.

The semiconductor chip 20 may include an isolation layer 23 formed in a semiconductor substrate 21 to define an active region 22. A gate dielectric layer 25 and a gate electrode 27 may be formed on the semiconductor substrate 21. The gate dielectric layer 25 may be formed between the active region 22 and the gate electrode 27. The gate dielectric layer 25 may be an insulating layer such as a silicon oxide layer, a silicon nitride layer, a silicon oxynitride layer or a combination thereof. The gate electrode 27 may be formed at a lower level than a top surface of the active region 22 as shown in the drawings. The gate electrode 27 may be formed of a conductive layer such as a polysilicon layer, a metal layer, a metal silicide layer or a combination thereof. A capping pattern 28 may be formed on the gate electrode 27. The capping pattern 28 may be formed of an insulating layer such as a silicon oxide layer, a silicon nitride layer, a silicon oxynitride layer, or a combination thereof. Source and drain regions 29 may be formed in the active regions 22 adjacent to opposite sides of the gate electrode 27.

An interlayer insulating layer 31 may be formed on the entire surface of the semiconductor substrate 21 having the gate electrode 27. A bit line 35 may be formed in the interlayer insulating layer 31. The bit line 35 may be electrically connected to one selected from the source and drain regions 29 by a bit plug 34 passing through the interlayer insulating layer 31. A buried contact plug 33 electrically connected to the other selected from the source and drain regions 29 may be formed through the interlayer insulating layer 31. The bit line 35, the bit plug 34, and the buried contact plug 33 may be formed of conductive layers such as polysilicon layers, metal layers, metal silicide layers or combinations thereof. A storage node 37, a capacitor dielectric layer 38, and a plate node 39 may be sequentially formed on the buried contact plug 33. The storage node 37 may be electrically connected to the buried contact plug 33. The storage node 37 and the plate node 39 may be formed of conductive layers such as polysilicon layers, metal layers, metal silicide layers or combinations thereof. The capacitor dielectric layer 38 may be an insulating layer such as a silicon oxide layer, a silicon nitride layer, a silicon oxynitride layer or a combination thereof.

A passivation layer 41 may be formed on the entire surface of the semiconductor substrate 21 having the gate electrode 27 and the plate node 39. The passivation layer 41 may be an insulating layer such as a silicon oxide layer, a silicon nitride layer, a silicon oxynitride layer or a combination thereof. Interconnection pads 43 and 44 may be formed in the passivation layer 41. The interconnection pads 43 and 44 may include a first pad 43 electrically connected to a power supply Vcc of the semiconductor chip 20, and a second pad 44 electrically connected to a ground Vss of the semiconductor chip 20. Here, the first pad 43 may be referred to as a power supply pad, and the second pad 44 may be referred to as a ground pad. The interconnection pads 43 and 44 may be formed of conductive layers such as metal layers, metal silicide layers or combinations thereof.

The separator 55 may be formed on the interconnection pads 43 and 44 and the passivation layer 41. The separator 55 may be formed of an insulating layer such as a silicon oxide layer, a silicon nitride layer, a silicon oxynitride layer or a combination thereof. In some embodiments, the separator 55 may be formed of a material layer having excellent heat dissipation characteristics. The separator 55 may be formed of a metal layer, a porous metal layer, a polymer layer, an insulating layer or a combination thereof. For example, the separator 55 may be formed by coating a polymer layer on a surface of a porous metal layer.

The rechargeable micro-battery 60 may be formed on the separator 55. The rechargeable micro-battery 60 may include a first current collector 61 and a second current collector 69, which face each other, a first polarizing electrode 63 in contact with the first current collector 61 and facing the second current collector 69, a second polarizing electrode 67 in contact with the second current collector 69 and facing the first polarizing electrode 63, and an electrolyte layer 65 formed between the first and second polarizing electrodes 63 and 67.

In some additional detail, the first current collector 61 and the first polarizing electrode 63 may be sequentially formed on the separator 55. The electrolyte layer 65 may be formed on the first polarizing electrode 63. The second polarizing electrode 67 may be formed on the electrolyte layer 65. The second current collector 69 may be formed on the second polarizing electrode 67. The electrolyte layer 65 may be in contact with the first and second polarizing electrodes 63 and 67. Sidewalls of the first polarizing electrode 63, the electrolyte layer 65, and the second polarizing electrode 67 may be surrounded by an insulating layer 73. The first current collector 61 may extend to a bottom surface of the insulating layer 73. In other words, the first current collector 61 may be interposed between the insulating layer 73 and the separator 55. The second current collector 69 may extend to a top surface of the insulating layer 73.

The first current collector 61 may be electrically connected to the first pad 43 by a first plug 75 passing through the separator 55. The second current collector 69 may be electrically connected to the second pad 44 by a second plug 76 passing through the insulating layer 73 and the separator 55. A hermetic seal 71 covering the first current collector 61, the first polarizing electrode 63, the electrolyte layer 65, the second polarizing electrode 67, the second current collector 69, and the insulating layer 73 may be formed on the separator 55.

Each of the first current collector 61, the second current collector 69, the first plug 75, and the second plug 76 may be formed of one selected from the group consisting of Cu, W, WN, Co, Ru, Ni, Ag, Ti, TiN, Ta, TaN, Al, Au, Pt, Sn and a combination thereof. The first current collector 61, the second current collector 69, the first plug 75, and the second plug 76 may be formed of conductive layers, which are different from or the same as each other.

The first and second polarizing electrodes 63 and 67 may be formed of material layers selected from the group consisting of RuO, IrO, CoO, ZrO, SrTiO, SrRuO, carbon nanotubes (CNTs), carbon nanofibers (CNFs), and activated carbon, and combinations thereof. For example, the first and second polarizing electrodes 63 and 67 may be formed of a combination of $RuO_2$ and CNTs. Alternatively, the first and second polarizing electrodes 63 and 67 may be formed of a combination of $RuO_2$ and activated carbon. The first and second polarizing electrodes 63 and 67 may be formed of material layers, which are different from or the same as each other.

The electrolyte layer 65 may be formed of one selected from the group consisting of polymer gels, $LiClO_4$, $NaClO_4$, $LiAsF_6$, $BF^{-4}$, $CF_3SO^{-3}$, and quaternary phosphonium ($PH_4^-$) salts. The polymer gels may be polymer-salt complexes. In this case, the polymer used herein may be one selected from the group consisting of polyethylene oxide, polyacrylonitrile, polymethylmethacrylate, polythiophine, polypyrrole, polyaniline, and combinations thereof. Moreover, the salt or ion may be one selected from the group consisting of $SCN^-$, $I^-$, $ClO_4^-$, $CF_3SO_3^-$, $Li^+$ (LiPON, LiF) and $H^+$. For example, the electrolyte layer 65 may be formed of LiF or LiPON.

Referring to FIG. 4, the rechargeable micro-battery 60 is further illustrated in an equivalent circuit diagram.

The first and second current collectors 61 and 69 may be electrically connected to the first and second pads 43 and 44 of FIG. 2, respectively. The first pad 43 of FIG. 2 may be electrically connected to the power supply Vcc of the semiconductor chip 20, and the second pad 44 of FIG. 2 may be electrically connected to the ground Vss of the semiconductor chip 20. Thus, it can be understood that the first and second current collectors 61 and 69 are connected to a charger 81.

As shown in FIG. 4, charge distributions in the first and second polarizing electrodes 63 and 67 and the electrolyte layer 65 may be determined according to bias applied to the first and second current collectors 61 and 69. In other words, the rechargeable micro-battery 60 may be repeatedly subjected to charging and discharging depending on the bias applied to the first and second current collectors 61 and 69. As a result, the rechargeable micro-battery 60 may be charged while power is supplied to the semiconductor chip 20 of FIG. 2 from an external source. When the power supply to the semiconductor chip 20 of FIG. 2 from the external source is interrupted, the rechargeable micro-battery 60 may serve to provide operating power to the semiconductor chip 20 of FIG. 2.

According to one more specific embodiment of the inventive concept, the first current collector 61 is formed from a Ti layer on a semiconductor substrate, and the first polarizing electrode 63 is formed from the Ti layer by electro-deposition using a $RuO_2$ layer. An aqueous solution used for the electro-deposition may be prepared by mixing $RuCl_3$, HCl, and KCl.

According to another more specific embodiment of the inventive concept, the first polarizing electrode 63 is formed from a combination of $RuO_2$ and carbon nanofibers (CNFs). To begin with, a paste may be prepared by mixing $RuO_2$, a Nafion solution (DuPont) and a small amount of water. The paste may be applied to a surface of a carbon fiber paper (Toray™ carbon paper, TGP-H-090) using a brush. Subsequently, the paper to which the paste is applied may be dried at 110° C. for 10 minutes.

Figure 5:
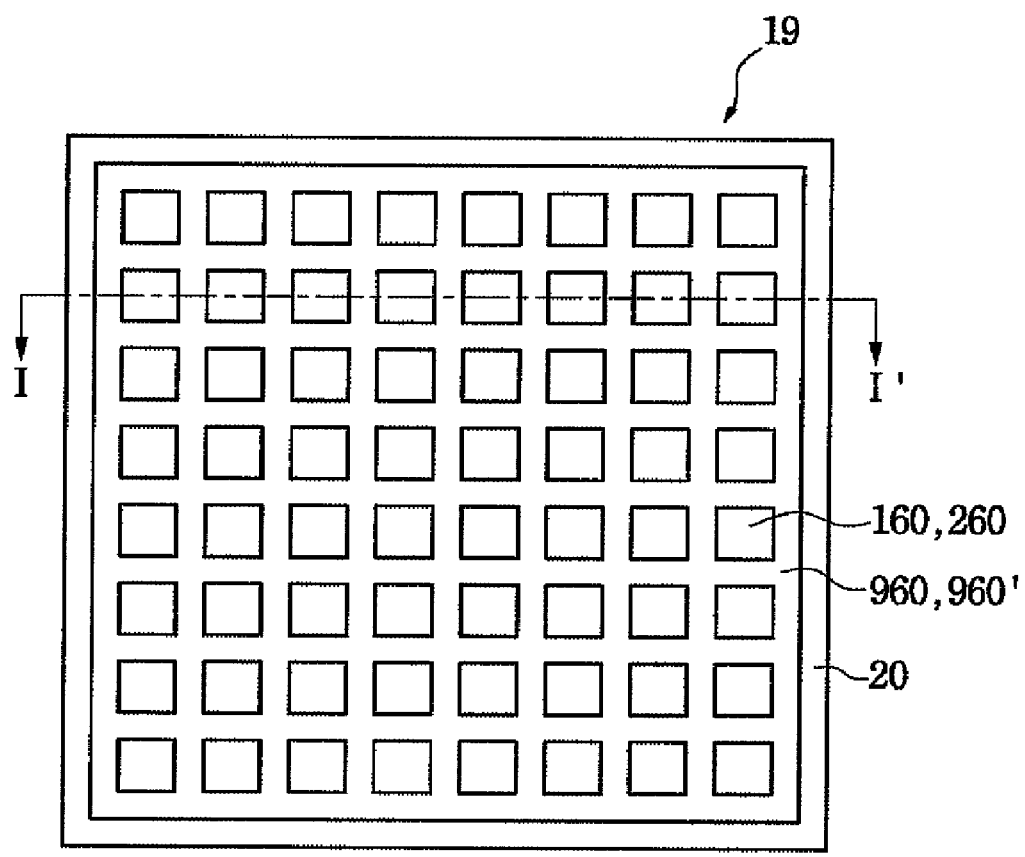
FIG. 5 is a plan view of a self-powered semiconductor device and a method of manufacturing the same according to another embodiment of the inventive concept.
Figure 6:
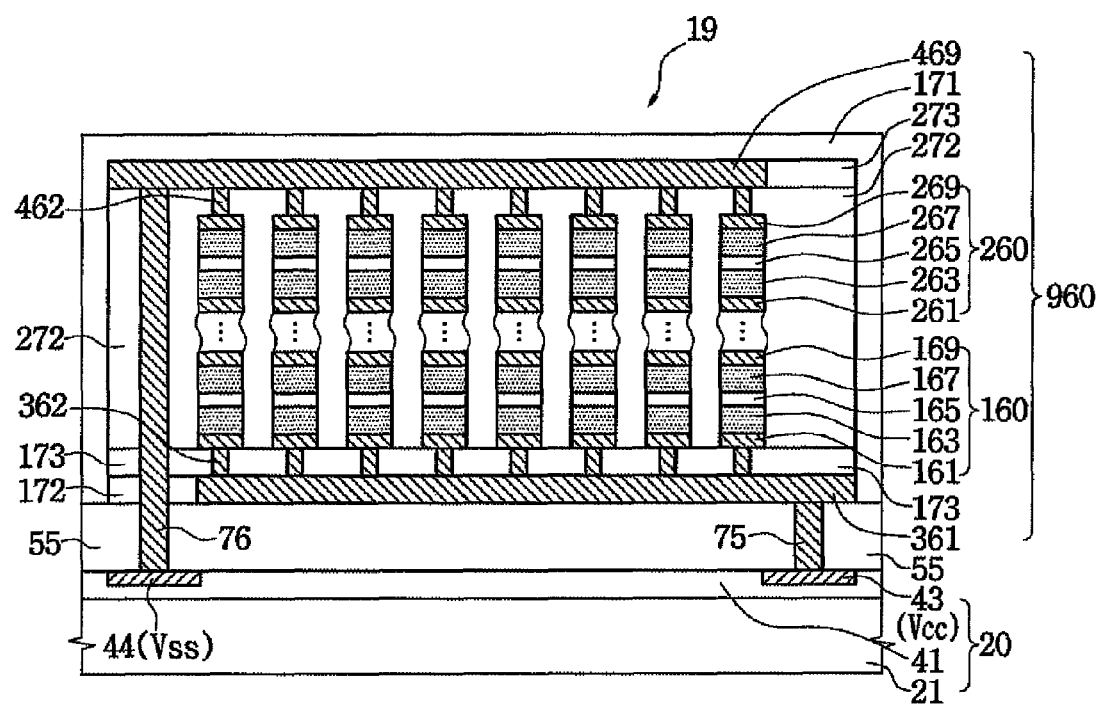
FIG. 6 is a cross-sectional view taken along line I-I' of FIG. 5.

According to yet another more specific embodiment of the inventive concept, the first polarizing electrode 63 is formed using a reactive sputtering process making use of a $RuO_2$ layer. FIG. 5 is a plan view illustrating a self-powered semiconductor device and a method of manufacturing consistent with this particular embodiment. FIG. 6 is a cross-sectional view taken along line I-I' of FIG. 5.

Referring to FIGS. 5 and 6, a self-powered semiconductor device 19 according to an embodiment of the inventive concept comprises a semiconductor chip 20, a separator 55, and a rechargeable micro-battery 960. The semiconductor chip 20 and the separator 55 may have configurations similar to those described in the second embodiment. Only differences between these embodiments will be described below, and like components will be understood with reference to the detailed description of the previously described embodiment.

The rechargeable micro-battery 960 may be formed on the separator 55. The rechargeable micro-battery 960 may be composed of sets of small-sized batteries 160 and 260 arranged along rows and columns. Each of the small-sized batteries 160 and 260 may include a lower battery 160 and an upper battery 260 formed on the lower battery 160. In addition, several other batteries may be formed between the lower and upper batteries 160 and 260. For example, eight different batteries may be sequentially stacked between the lower and upper batteries 160 and 260. Alternatively, the upper battery 260 may be omitted. As shown in FIG. 5, the small-sized batteries 160 and 260 may be arranged along eight rows and eight columns.

The lower battery 160 may include a first current collector 161 and a second current collector 169, which face each other, a first polarizing electrode 163 in contact with the first current collector 161 and facing the second current collector 169, a second polarizing electrode 167 in contact with the second current collector 169 and facing the first polarizing electrode 163, and an electrolyte layer 165 formed between the first and second polarizing electrodes 163 and 167.

The upper battery 260 may include a first current collector 261 and a second current collector 269, which face each other, a first polarizing electrode 263 in contact with the first current collector 261 and facing the second current collector 269, a second polarizing electrode 267 in contact with the second current collector 269 and facing the first polarizing electrode 263, and an electrolyte layer 265 formed between the first and second polarizing electrodes 263 and 267.

A first interconnection 361 may be formed under the lower battery 160, and a second interconnection 469 may be formed on the upper battery 260. Sidewalls of the first interconnection 361 may be covered with a first insulating layer 172. A second insulating layer 173 may be formed between the first interconnection 361 and the lower battery 160. The lower battery 160 and the upper battery 260 may be covered with a third insulating layer 272. Sidewalls of the second interconnection 469 may be covered with a fourth insulating layer 273. The first current collector 161 of the lower battery 160 may be electrically connected to the first interconnection 361 by a lower plug 362 passing through the second insulating layer 173. The second current collector 269 of the upper battery 260 may be electrically connected to the second interconnection 469 by an upper plug 462 passing through the third insulating layer 272.

The first interconnection 361 may be electrically connected to the first pad 43 by a first plug 75 passing through the separator 55. The second interconnection 469 may be electrically connected to the second pad 44 by a second plug 76 sequentially passing through the third to first insulating layers 272, 173 and 172 and the separator 55. A hermetic seal 171 may be formed on the separator 55. The hermetic seal 171 may cover the small-sized batteries 160 and 260, the first to fourth insulating layers 172, 173, 272 and 273, and the first and second interconnections 361 and 469. The lower and upper plugs 362 and 462, and the first and second interconnections 361 and 469 may be formed of conductive layers such as metal layers.

In certain embodiments of the inventive concept, the second current collector 169 of the lower battery 160 may be electrically connected to the second interconnection 469 by another conductive interconnection (not shown). Similarly, the first current collector 261 of the upper battery 260 may be electrically connected to the first interconnection 361 by still another conductive interconnection (not shown).

Figure 7:
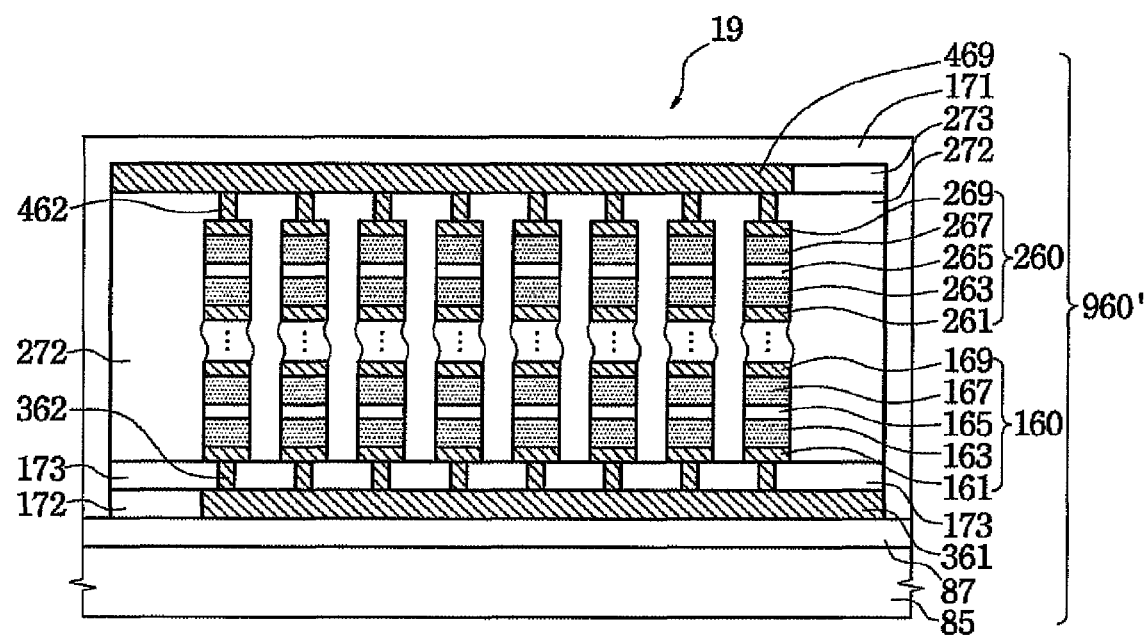
FIGS. 7 and 8 are cross-sectional views taken along line I-I' of FIG. 5 to illustrate a self-powered semiconductor device and a method of manufacturing the same according to yet another embodiment of the inventive concept.
Figure 8:
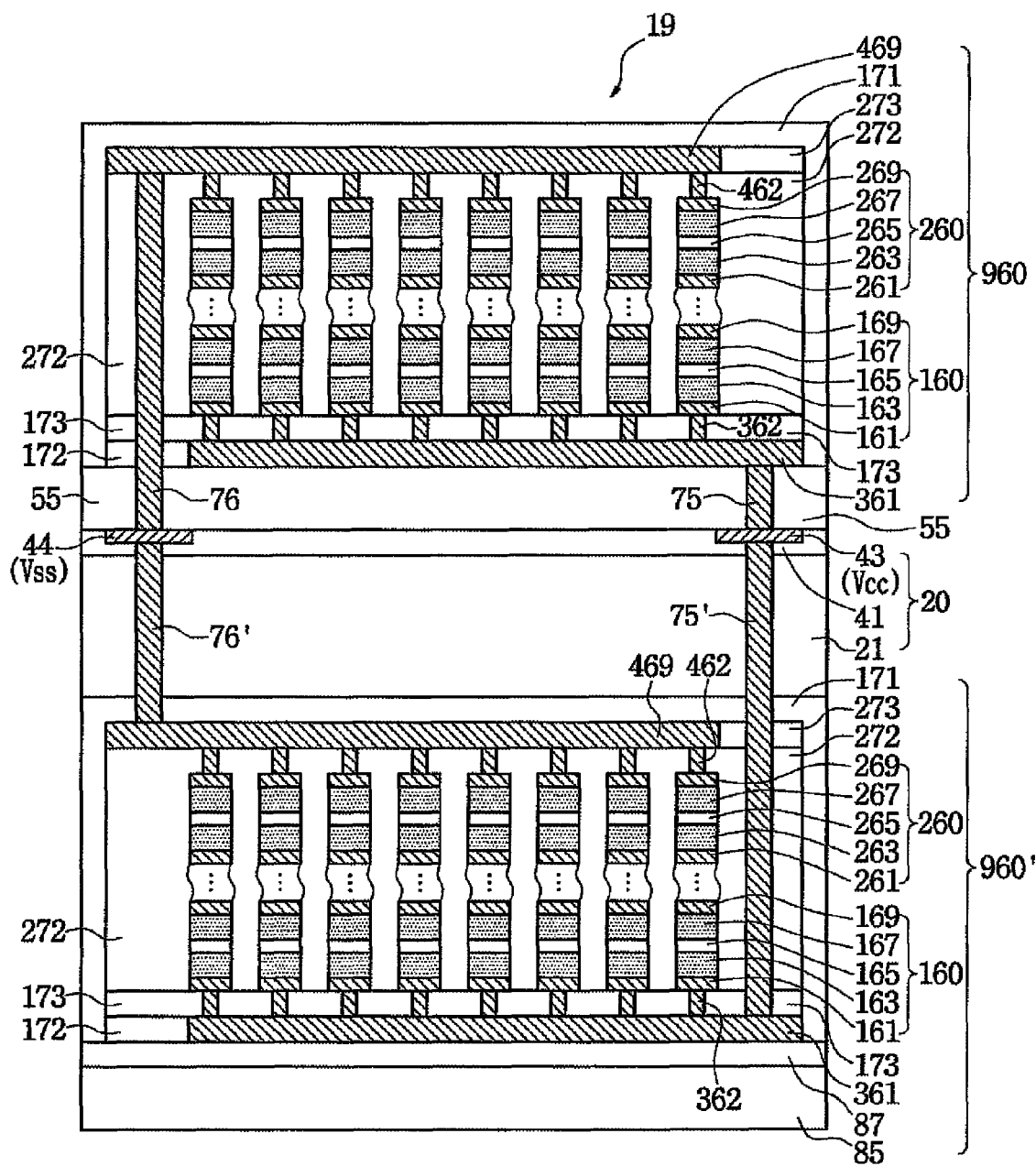

FIGS. 7 and 8 are cross-sectional views taken along line I-I' of FIG. 5 to further illustrate a self-powered semiconductor device and a method of manufacturing the same according to another embodiment of the inventive concept.

Referring to FIG. 7, a rechargeable micro-battery 960' may be formed on a battery substrate 85. The battery substrate 85 may be a semiconductor substrate such as a silicon wafer. In this case, the battery substrate 85 may have substantially the same thermal expansion coefficient as the semiconductor chip 20 of FIG. 6. In contrast, the battery substrate 85 may be formed of various materials such as a metal plate, a synthetic resin plate or a flexible substrate. Hereinafter, it is assumed that the battery substrate 85 is a silicon wafer.

An interlayer insulating layer 87 may be formed on the battery substrate 85. The interlayer insulating layer 87 may be an insulating layer such as a silicon oxide layer, a silicon nitride layer, a silicon oxynitride layer, or a combination thereof. Similar to the third embodiment, small-sized batteries 160 and 260, first to fourth insulating layers 172, 173, 272 and 273, first and second interconnections 361 and 469, a lower plug 362, an upper plug 462 and a hermetic seal 171 may be formed on the interlayer insulating layer 87.

Referring to FIG. 8, a self-powered semiconductor device 19 may include a semiconductor chip 20, a separator 55, a first rechargeable micro-battery 960, and a second rechargeable micro-battery 960'. The semiconductor chip 20, the separator 55 and the first rechargeable micro-battery 960 may have configurations similar to those of the third embodiment. Here again differences between the previously described embodiments will be noted.

The second rechargeable micro-battery 960' may be attached to a rear surface of the semiconductor chip 20. An adhesive layer such as an epoxy resin may be formed between the second rechargeable micro-battery 960' and the semiconductor chip 20, but will be omitted for simplicity of description. Referring to FIG. 7, the second rechargeable micro-battery 960' may include the interlayer insulating layer 87, the small-sized batteries 160 and 260, the first to fourth insulating layers 172, 173, 272 and 273, the first and second interconnections 361 and 469, the lower plug 362, the upper plug 462, and the hermetic seal 171, which are formed on the battery substrate 85.

The first interconnection 361 of the second rechargeable micro-battery 960' may be electrically connected to the first pad 43 by a first rear surface plug 75' passing through the second to fourth insulating layers 173, 272, and 273, the hermetic seal 171 and the semiconductor chip 20. The second interconnection 469 of the second rechargeable micro-battery 960' may be electrically connected to the second pad 44 by a second rear surface plug 76' passing through the hermetic seal 171 and the semiconductor chip 20.

Figure 9:
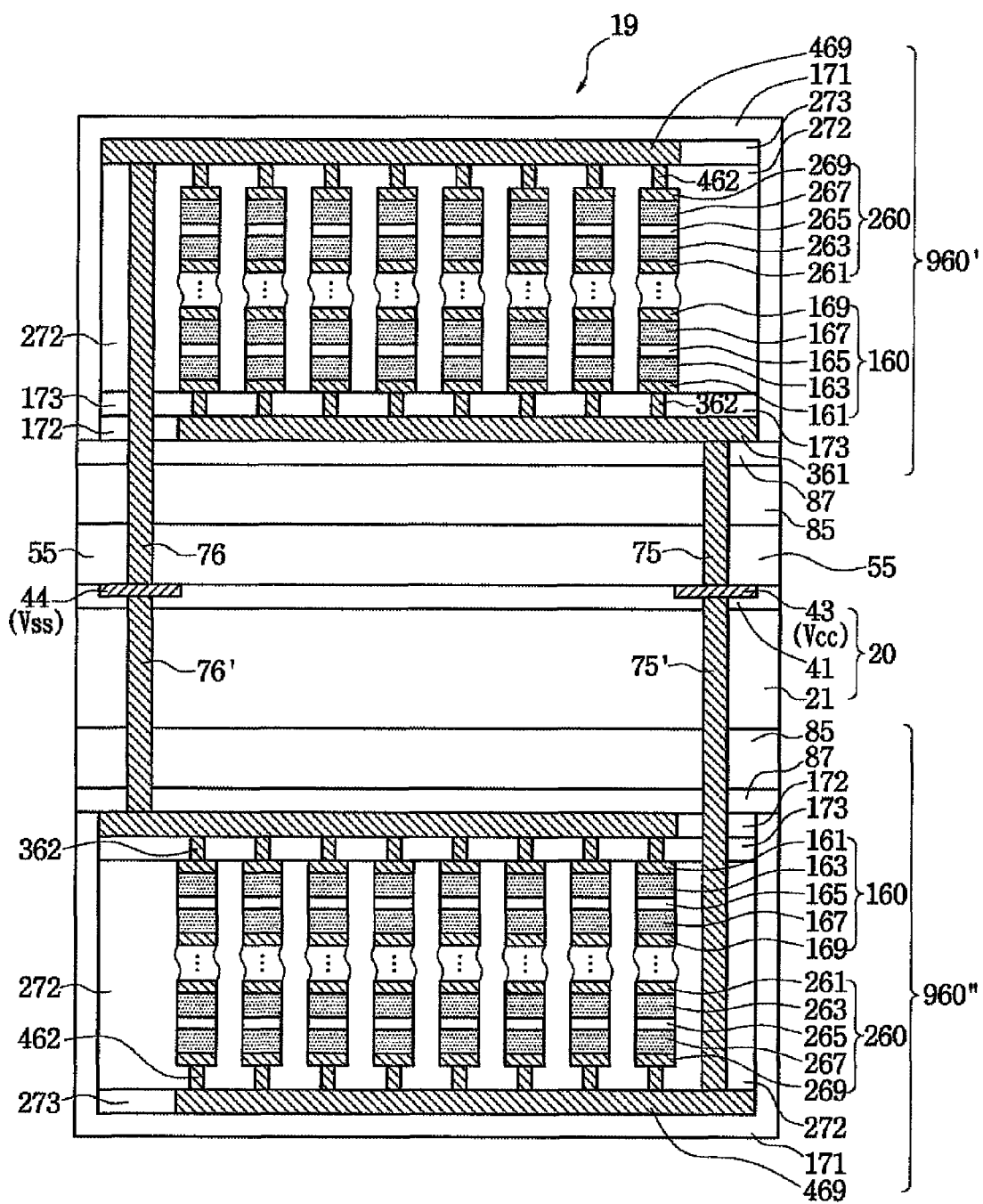
FIG. 9 is a cross-sectional view taken along line I-I' of FIG. 5 to illustrate a self-powered semiconductor device and a method of manufacturing the same according to yet another embodiment of the inventive concept.

FIG. 9 is a cross-sectional view taken along line I-I' of FIG. 5 and further illustrates a self-powered semiconductor device and a method of manufacturing the same according to yet another embodiment of the inventive concept.

Referring to FIG. 9, a self-powered semiconductor device 19 according to the fifth embodiment may include a semiconductor chip 20, a separator 55, a first rechargeable micro-battery 960', and a second rechargeable micro-battery 960". The semiconductor chip 20 and the separator 55 may have configurations similar to those of the fourth embodiment. The first and second rechargeable micro-batteries 960' and 960" may have configurations similar to those shown in FIG. 7 according to the fourth embodiment. As before, only differences between the various illustrated embodiments will be described.

The first rechargeable micro-battery 960' may be attached to the separator 55. An adhesive layer may be formed between the battery substrate 85 and the separator 55, but will be omitted for simplicity of description. The first interconnection 361 of the first rechargeable micro-battery 960' may be electrically connected to the first pad 43 by a first plug 75 passing through the interlayer insulating layer 87, the battery substrate 85, and the separator 55. The second interconnection 469 of the first rechargeable micro-battery 960' may be electrically connected to the second pad 44 by a second plug 76 passing through the third to first insulating layers 272, 173, and 172, the interlayer insulating layer 87, the battery substrate 85, and the separator 55.

The second rechargeable micro-battery 960" may be attached to a rear surface of the semiconductor chip 20. An adhesive layer may be formed between the battery substrate 85 of the second rechargeable micro-battery 960" and the semiconductor chip 20, but will be omitted for simplicity of description. The second interconnection 469 of the second rechargeable micro-battery 960" may be electrically connected to the first pad 43 by a first rear surface plug 75' passing through the third to first insulating layers 272, 173 and 172, the interlayer insulating layer 87, the battery substrate 85, and the semiconductor chip 20. The first interconnection 361 of the second rechargeable micro-battery 960" may be electrically connected to the second pad 44 by a second rear surface plug 76' passing through the interlayer insulating layer 87, the battery substrate 85, and the semiconductor chip 20.

Sixth Embodiment

Figure 10:
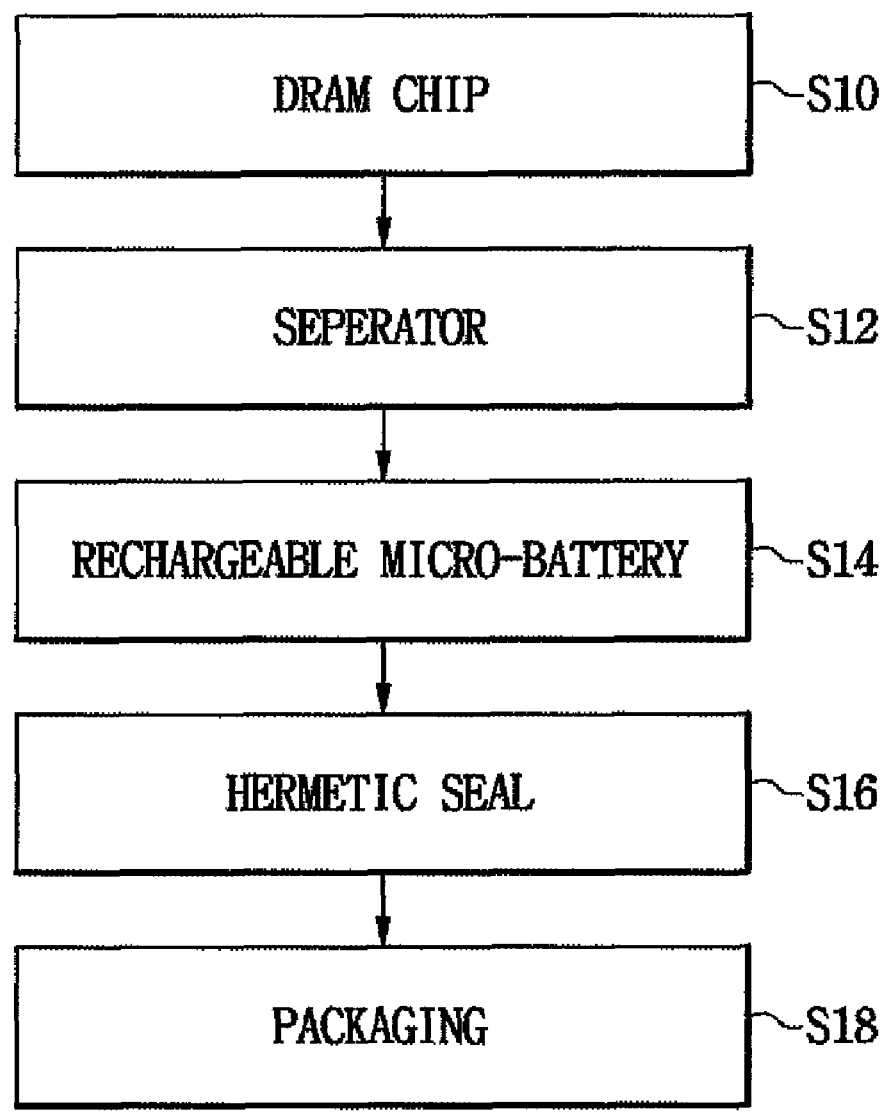
FIGS. 10 through 12 are flow charts summarizing various methods of manufacturing a self-powered semiconductor device still more embodiments of the inventive concept.
Figure 11:
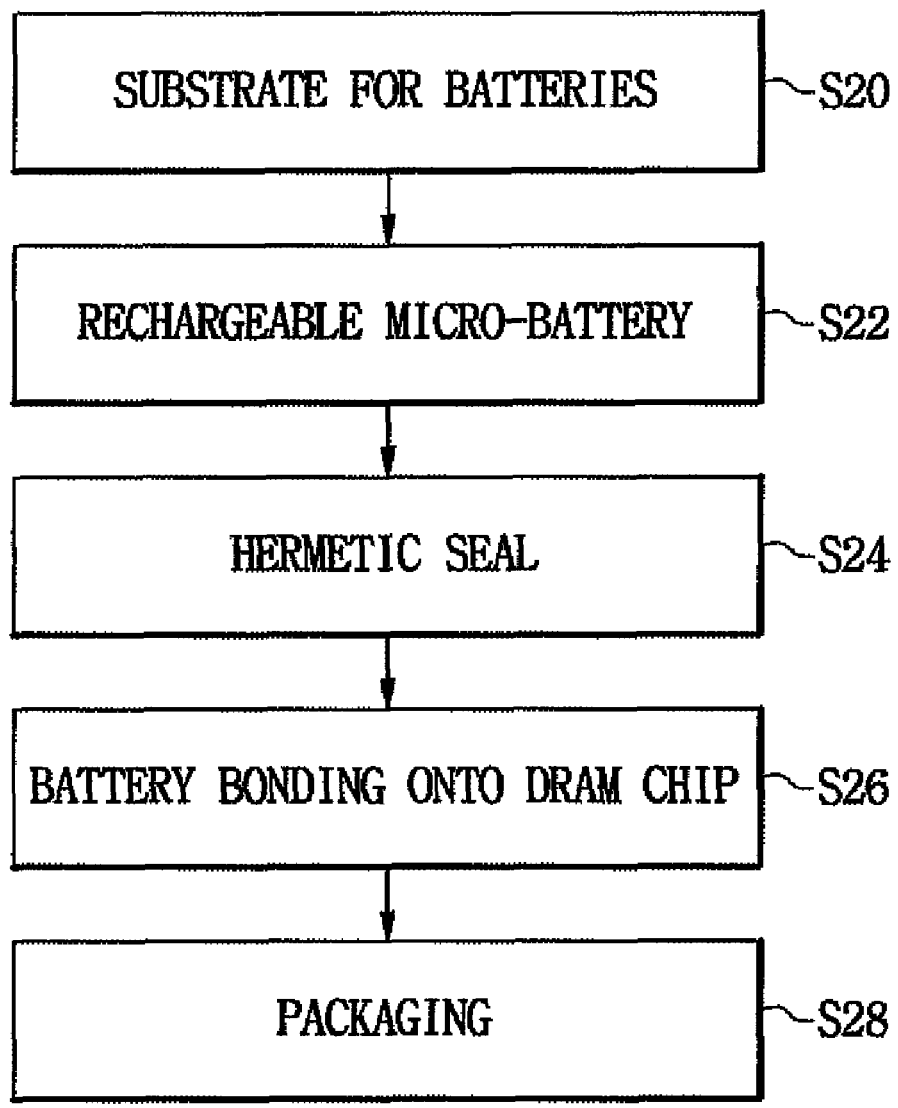
Figure 12:
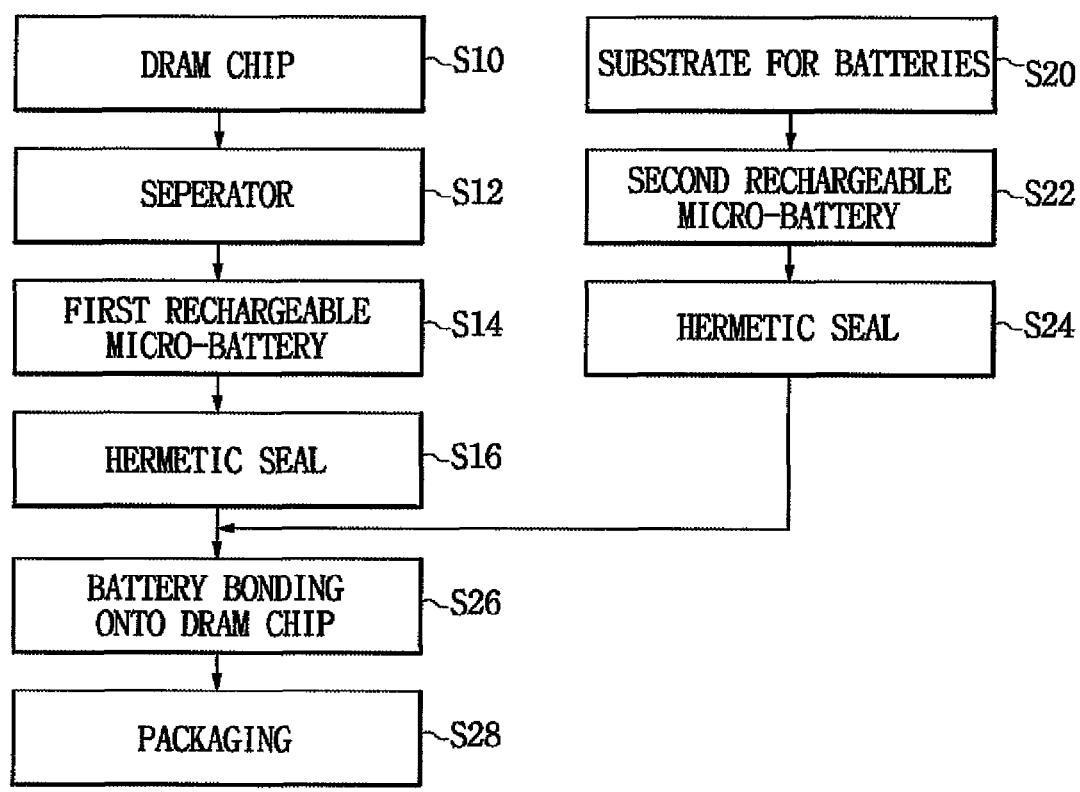

FIGS. 10 through 12 are flow charts summarizing various methods of manufacturing a self-powered semiconductor device according to a sixth embodiment.

Referring to FIG. 10, a method of manufacturing a self-powered semiconductor device according to the sixth embodiment may include forming a DRAM chip (S10), forming a separator on the DRAM chip (S12), forming a rechargeable micro-battery on the separator (S14), hermetically sealing the rechargeable micro-battery (S16), and packaging all the components (S18).

The DRAM chip may correspond to the semiconductor chip 20 shown in FIGS. 2 and 3. The separator may correspond to reference numeral 55 of FIG. 2. The rechargeable micro-battery may correspond to reference numeral 60 of FIG. 2 and/or 960 of FIG. 6. The hermetical sealing may correspond to reference numeral 71 of FIG. 2 and/or 171 of FIG. 6.

Referring to FIG. 11, another method of manufacturing the self-powered semiconductor device according to another embodiment may include preparing a battery substrate (S20), forming a rechargeable micro-battery on the battery substrate (S22), hermetically sealing the rechargeable micro-battery (S24), attaching the rechargeable micro-battery to a DRAM chip (S26), and packaging all the components (S28).

The battery substrate may correspond to reference numeral 85 of FIG. 7. The attaching of the rechargeable micro-battery to the DRAM chip (S26) may be similar to that described in the fifth embodiment with reference to FIG. 9.

Referring to FIG. 12, still another method of manufacturing a self-powered semiconductor device according to still another embodiment may include forming a DRAM chip (S10), forming a separator on one surface of the DRAM chip (S12), forming a first rechargeable micro-battery on the separator (S14), hermetically sealing the first rechargeable micro-battery (S16), preparing a battery substrate (S20), forming a second rechargeable micro-battery on the battery substrate (S22), hermetically sealing the second rechargeable micro-battery (S24), attaching the second rechargeable micro-battery to the other surface of the DRAM chip (S26), and packaging all the components (S28).

For example, the attaching of the second rechargeable micro-battery to the other surface of the DRAM chip (S26) may be similar to that described in the fourth embodiment with reference to FIG. 8.

Consequently, a data storage device having a buffer controller, a non-volatile memory, and a self-powered semiconductor device is provided. The self-powered semiconductor device includes a semiconductor chip and a rechargeable micro-battery attached to the semiconductor chip. The semiconductor chip may be a volatile memory having a high operating speed like a DRAM. When power supply from an external power source is interrupted or unstably provided to the semiconductor chip, the rechargeable micro-battery may serve to stably provide operating power to the semiconductor chip. As a result, the data storage device having a high operating speed and a low error rate can be realized.

The foregoing is illustrative of embodiments and is not to be construed as limiting thereof. Although a few embodiments have been described, those skilled in the art will readily appreciate that many modifications are possible in embodiments without materially departing from the novel teachings and advantages. Accordingly, all such modifications are intended to be included within the scope of this inventive concept as defined in the claims. Therefore, it is to be understood that the foregoing is illustrative of various embodiments and is not to be construed as limited to the specific embodiments disclosed, and that modifications to the disclosed embodiments, as well as other embodiments, are intended to be included within the scope of the appended claims.

What is claimed is:

1. A data storage device, comprising:
an interface;
a buffer controller adjacent to and electrically connected to the interface;
a memory controller adjacent to and electrically connected to the buffer controller;
a non-volatile memory adjacent to and electrically connected to the memory controller; and
a self-powered semiconductor device adjacent to and electrically connected to the buffer controller, the self-powered semiconductor device including a semiconductor chip and a rechargeable micro-battery attached to the semiconductor chip,
wherein the rechargeable micro-battery comprises facing first and second current collectors, a first polarizing electrode in contact with the first current collector and facing the second current collector, a second polarizing electrode in contact with the second current collector and facing the first polarizing electrode, and an electrolyte layer formed between the first and second polarizing electrodes, and
wherein the rechargeable micro-battery further comprises a plurality of sets of small-sized batteries.

2. The device according to claim 1, wherein the self-powered semiconductor device further comprises a conductive plug, and one of the first and second current collectors is electrically connected to a power supply pad of the semiconductor chip by the conductive plug.

3. The device according to claim 1, wherein the rechargeable micro-battery further comprises a battery substrate adjacent to the first current collector, wherein the battery substrate is a semiconductor substrate.

4. The device according to claim 1, wherein the first and second polarizing electrodes include at least one material layer selected from a group consisting of; RuO, IrO, CoO, ZrO, SrTiO, SrRuO, carbon nanotubes (CNTs), carbon nanofibers (CNFs), and activated carbon.

5. The device according to claim 1, wherein the first and second polarizing electrodes are formed of a combination of $RuO_2$ and CNTs, or a combination of $RuO_2$ and activated carbon.

6. The device according to claim 1, wherein the electrolyte layer includes at least one selected from a group consisting of; polymer gels, $LiClO_4$, $NaClO_4$, $LiAsF_6$, $BF^{-4}$, $CF_3SO^{-3}$, and quaternary phosphonium ($PH_4^-$) salts.

7. The device according to claim 6, wherein the electrolyte layer is at least one polymer gel, the polymer gel being a polymer-salt complex.

8. The device according to claim 7, wherein the polymer-salt complex comprises a polymer being one selected from a group consisting of; polyethylene oxide, polyacrylonitrile, polymethylmethacrylate, polythiophine, polypyrrole, polyaniline.

9. The device according to claim 7, wherein the polymer-salt complex comprises a salt being one selected from a group consisting of; $SCN^-$, $I^-$, $ClO_4^-$, $CF_3SO_3^-$, $Li^+$ (LiPON, LiF) and $H^+$.

10. The device according to claim 1, wherein the electrolyte layer comprises a LiF or LiPON layer.

11. The device according to claim 1, wherein the first and second current collectors are formed from at least one selected from a group consisting of; Cu, W, WN, Co, Ru, Ni, Ag, Ti, TiN, Ta, TaN, Al, Au, Pt, and Sn.

12. A data storage device, comprising:
an interface;
a buffer controller adjacent to and electrically connected to the interface;
a memory controller adjacent to and electrically connected to the buffer controller;
a non-volatile memory adjacent to and electrically connected to the memory controller; and
a self-powered semiconductor device adjacent to and electrically connected to the buffer controller, the self-powered semiconductor device including a semiconductor chip and a rechargeable micro-battery attached to the semiconductor chip,
wherein the rechargeable micro-battery comprises facing first and second current collectors, a first polarizing electrode in contact with the first current collector and facing the second current collector, a second polarizing electrode in contact with the second current collector and facing the first polarizing electrode, and an electrolyte layer formed between the first and second polarizing electrodes, and
wherein the self-powered semiconductor device further comprises a separator formed between the semiconductor chip and the rechargeable micro-battery, the separator being formed of at least one selected from a group consisting of a silicon oxide layer, a silicon nitride layer, a silicon oxynitride layer, a metal layer, a porous metal layer, and a polymer layer.

* * * * *